(12) United States Patent
Kim et al.

(10) Patent No.: US 11,728,200 B2
(45) Date of Patent: Aug. 15, 2023

(54) WAFER BONDING APPARATUSES

(71) Applicant: Samsung Electronics Co., Ltd., Suwon-si (KR)

(72) Inventors: Hoe Chul Kim, Suwon-si (KR); Seok Ho Kim, Suwon-si (KR); Tae Yeong Kim, Suwon-si (KR); Hoon Joo Na, Suwon-si (KR); Hyung Jun Jeon, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 765 days.

(21) Appl. No.: 16/703,062

(22) Filed: Dec. 4, 2019

(65) Prior Publication Data

US 2020/0373186 A1    Nov. 26, 2020

(30) Foreign Application Priority Data

May 23, 2019  (KR) .................... 10-2019-0060541

(51) Int. Cl.
*H01L 21/683* (2006.01)
*H01L 23/00* (2006.01)
*H01L 21/677* (2006.01)

(52) U.S. Cl.
CPC .... *H01L 21/6836* (2013.01); *H01L 21/67757* (2013.01); *H01L 24/94* (2013.01)

(58) Field of Classification Search
CPC ......... H01L 21/67092; H01L 21/67103; H01L 21/6838; H01L 21/67248; H01L 21/67259; H01L 21/683; H01L 21/67098
See application file for complete search history.

(56) References Cited

U.S. PATENT DOCUMENTS

| | | | |
|---|---|---|---|
| 8,899,289 B2 | 12/2014 | Deguchi et al. | |
| 9,859,246 B2 | 1/2018 | Fehkuhrer | |
| 2012/0214290 A1 | 8/2012 | Sugaya et al. | |
| 2014/0265165 A1* | 9/2014 | Lin ................... | H01L 21/67092 279/142 |
| 2017/0207089 A1 | 7/2017 | Lin et al. | |
| 2017/0207191 A1 | 7/2017 | Huang et al. | |
| 2018/0047699 A1 | 2/2018 | Omori et al. | |
| 2018/0323089 A1 | 11/2018 | Wada et al. | |
| 2018/0350639 A1* | 12/2018 | Lin ......................... | H01L 24/75 |
| 2019/0189593 A1* | 6/2019 | Kim ................... | H01L 21/68742 |
| 2019/0228995 A1* | 7/2019 | Wimplinger ....... | H01L 21/68735 |
| 2020/0212003 A1* | 7/2020 | Bayless ................ | H01L 24/83 |

FOREIGN PATENT DOCUMENTS

| | | |
|---|---|---|
| JP | 5792831 B2 | 10/2015 |
| JP | 2018-026413 A | 2/2018 |
| JP | 2018190826 A * | 11/2018 |
| KR | 10-1111063 B1 | 2/2012 |

* cited by examiner

*Primary Examiner* — Brian Turner

(74) *Attorney, Agent, or Firm* — Harness, Dickey & Pierce, P.L.C.

(57) ABSTRACT

A wafer bonding apparatus is provided includes a lower support plate configured to structurally support a first wafer on an upper surface of the lower support plate; a lower structure adjacent to the lower support plate and movable in a vertical direction that is perpendicular to the upper surface of the lower support plate, an upper support plate configured to structurally support a second wafer on a lower surface of the lower support plate, and an upper structure adjacent to the upper support plate and movable in the vertical direction.

20 Claims, 12 Drawing Sheets

WAFER BONDING APPARATUSES

This application claims priority to and the benefit of, under 35 U.S.C. § 119, Korean Patent Application No. 10-2019-0060541, filed May 23, 2019 in the Korean Intellectual Property Office, the disclosure of which is hereby incorporated herein by reference in its entirety.

BACKGROUND

1. Field

The present inventive concepts relate to wafer bonding apparatuses.

2. Description of the Related Art

A wafer bonding process for bonding or joining two wafers to each other may be performed in a fabricating process to fabricate a semiconductors device. Such a wafer bonding process may be performed to increase a mounting density of chips in the semiconductor device. Accordingly, the semiconductor device having a structure in which chips are stacked may have a reduced wiring length between the chips, based on the increased mounting density of the chips in the semiconductor device, which may be advantageous for high-speed signal processing. A wafer bonding process may be performed for the purpose of bonding a device wafer to a carrier wafer to facilitate handling of the device wafer.

When fabricating a semiconductor device having a stacked chip structure, productivity may be improved by bonding in the unit of wafer and then separating in the unit of stacked chip, rather than bonding in the unit of chip.

The wafer bonding process may be performed in a manner that directly bonds the two wafers without separate media. In such a case, the wafer bonding process may be performed, using a wafer bonding apparatus equipped with support plates on which the wafers are disposed and fixed, and a pressing device (e.g., a pin) for pressing the wafer.

SUMMARY

Aspects of the present inventive concepts provide a wafer bonding apparatus capable of bonding a wafer, while preventing an occurrence of defect.

According to some example embodiments of the present inventive concepts, a wafer bonding apparatus may include a lower support plate configured to structurally support a first wafer on an upper surface of the lower support plate, a lower structure adjacent to the lower support plate and movable in a vertical direction that is perpendicular to the upper surface of the lower support plate, an upper support plate configured to structurally support a second wafer on a lower surface of the lower support plate, and an upper structure adjacent to the upper support plate and movable in the vertical direction.

According to some example embodiments of the present inventive concepts, a wafer bonding apparatus may include a lower support plate configured to structurally support a first wafer on an upper surface of the lower support plate, a lower structure adjacent to the lower support plate, an upper support plate configured to structurally support a second wafer on a lower surface of the lower support plate, an upper structure adjacent to the upper support plate, and a controller configured to adjust an interval between the lower structure and the upper structure.

According to some example embodiments of the present inventive concepts, a wafer bonding apparatus may include a lower support plate configured to structurally support a first wafer on an upper surface of the lower support plate, a first sub-lower structure adjacent to one side surface of the lower support plate and movable in a vertical direction that is perpendicular to the upper surface of the lower support plate, a second sub-lower structure adjacent to another side surface of the lower support plate and movable in the vertical direction, an upper support plate configured to structurally support a second wafer on a lower surface of the lower support plate, a first sub-upper structure adjacent to one side surface of the upper support plate and movable in the vertical direction, and a second sub-upper structure adjacent to another side surface of the upper support plate and moveable in the vertical direction.

However, aspects of the present inventive concepts are not restricted to the ones set forth herein. The above and other aspects of the present inventive concepts will become more apparent to one of ordinary skill in the art to which the present inventive concepts pertains by referencing the detailed description of the present inventive concepts given below.

BRIEF DESCRIPTION OF THE DRAWINGS

The above and other aspects and features of the present inventive concepts will become more apparent by describing in detail example embodiments thereof with reference to the attached drawings, in which.

DETAILED DESCRIPTION OF THE EMBODIMENTS

Hereinafter, various example embodiments of the present inventive concepts will be described with reference to the attached drawings.

Figure 1:
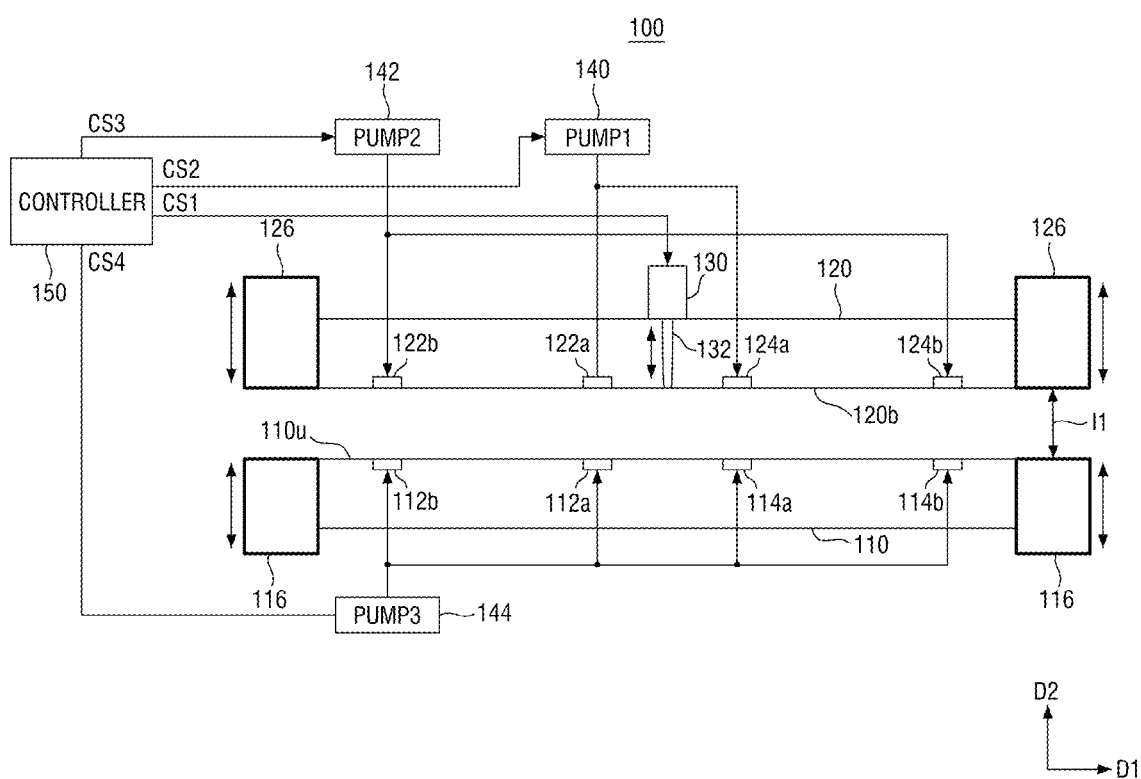
FIGS. 1, 2, and 3 are diagrams for explaining a wafer bonding apparatus according to some example embodiments of the present inventive concepts.
Figure 2:
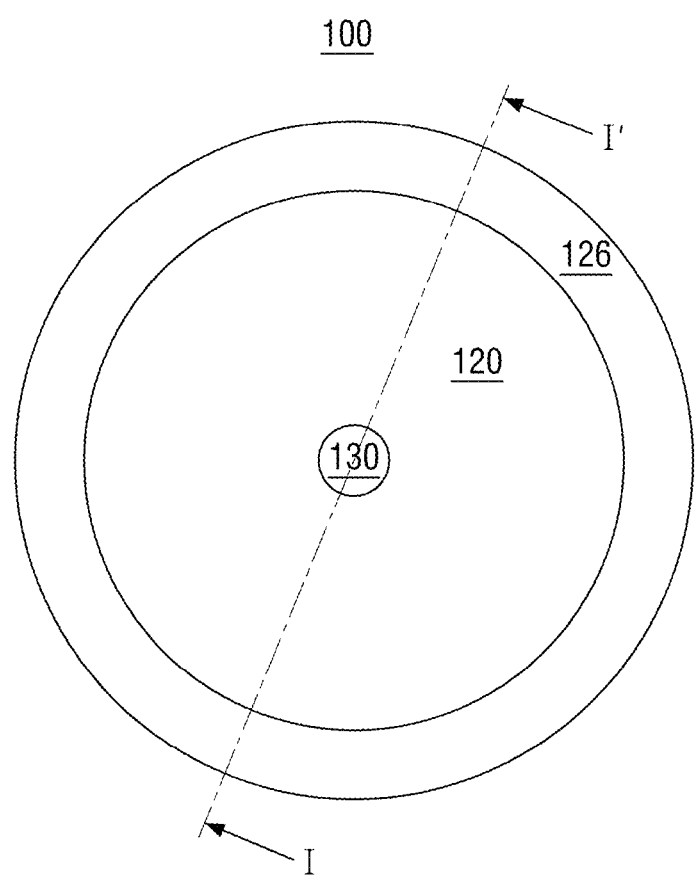
Figure 3:
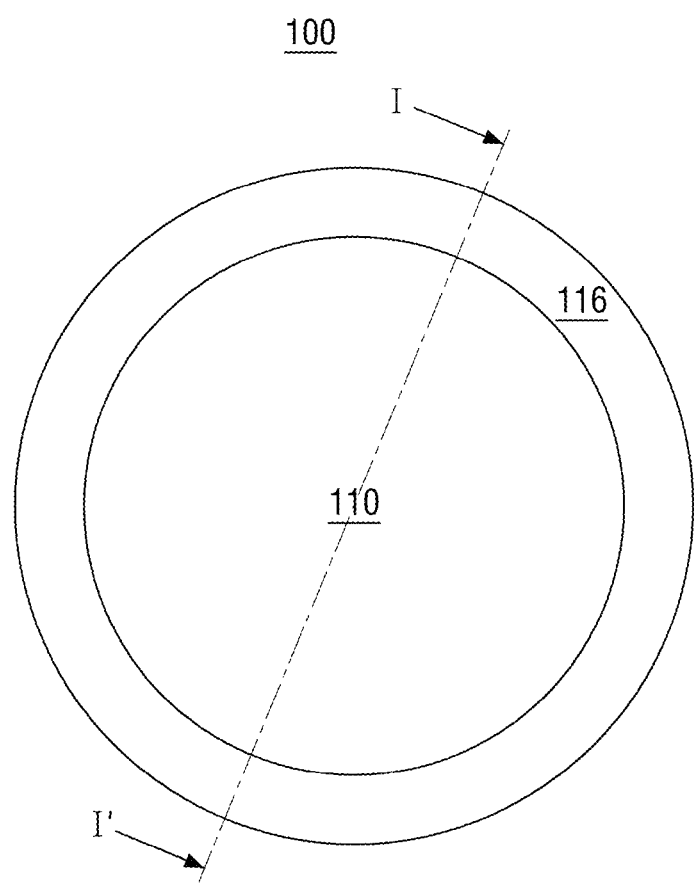

FIGS. 1, 2, and 3 are diagrams for explaining a wafer bonding apparatus 100 according to some example embodiments of the present inventive concepts. Specifically, FIG. 1 is a cross-sectional view of the wafer bonding apparatus 100, FIG. 2 is a top view of the wafer bonding apparatus 100, and FIG. 3 is a bottom view of the wafer bonding apparatus 100. Additionally, FIG. 1 is a cross-sectional view of the wafer bonding apparatus 100 along cross-sectional view line I-I' of FIGS. 2-3.

Referring to FIG. 1, the wafer bonding apparatus 100 according to some example embodiments of the present inventive concepts may include a lower support plate 110, a lower structure 116, an upper support plate 120, an upper structure 126, a pressing device 130 and a controller 150.

The lower support plate 110 is also referred to as a lower chuck, and a first wafer 10 to be described later with reference to FIG. 4 may be disposed on an upper surface of the lower support plate 110, such that the lower support plate 110 structurally supports the first wafer 10 on an upper surface 110u of the lower support plate 110. In some example embodiments, the lower support plate 110 may include a plurality of vacuum grooves 112a, 112b, 114a and 114b for fixing the first wafer 10 to the upper surface thereof.

The plurality of vacuum grooves 112a, 112b, 114a and 114b of the lower support plate 110 may include internal vacuum grooves 112a and 114a disposed to be adjacent to a center of the lower support plate 110, and external vacuum grooves 112b and 114b disposed to be adjacent to an outer part of the support plate 110. The positions and the number of vacuum grooves illustrated in the drawing are merely an example, and the scope of the present inventive concepts are not limited thereto.

The plurality of vacuum grooves 112a, 112b, 114a and 114b of the lower support plate 110 may be disposed along a circular shape when viewed from the upper surface of the lower support plate 110. However, the scope of the present inventive concepts is not limited thereto, and the plurality of vacuum grooves 112a, 112b, 114a and 114b may have an arbitrary arrangement.

The upper support plate 120 is also referred to as an upper chuck, and a second wafer 20 which is bonded to a first wafer 10 to be described later with reference to FIG. 4 may be disposed on the lower surface 120b of the upper support plate 120. In some example embodiments, the upper support plate 120 may include a plurality of vacuum grooves 122a, 122b, 124a and 124b for fixing the second wafer 20 to the lower surface thereof.

The plurality of vacuum grooves 122a, 122b, 124a and 124b of the upper support plate 120 may include internal vacuum grooves 122a and 124a disposed to be adjacent to the center of the upper support plate 120, and external vacuum grooves 122b and 124b disposed to be adjacent to the outer part of the upper support plate 120. The positions and the number of vacuum grooves illustrated in the drawing are merely an example, and the scope of the present inventive concepts is not limited thereto.

The plurality of vacuum grooves 122a, 122b, 124a and 124b of the upper support plate 120 may be disposed along a circular shape when viewed from the lower surface of the upper support plate 120. However, the scope of the present inventive concepts is not limited thereto, and the plurality of vacuum grooves 122a, 122b, 124a and 124b may have an arbitrary arrangement.

The internal vacuum grooves 122a and 124a of the upper support plate 120 may be connected to a first vacuum pump 140 through an internal pipe formed inside the upper support plate 120 and an external pipe formed outside thereof. When the first vacuum pump 140 operates, vacuum adsorption is performed by the internal vacuum grooves 122a and 124a, and a central part of the second wafer 20 may be adsorbed and fixed to the lower surface of the upper support plate 120. Unlike this, when the first vacuum pump 140 stops operating, the central part of the second wafer 20 may be released (separated) from the lower surface of the upper support plate 120.

The external vacuum grooves 122b and 124b of the upper support plate 120 may be connected to a second vacuum pump 142 through an internal pipe formed inside the upper support plate 120 and an external pipe formed outside thereof. When the second vacuum pump 142 operates, vacuum adsorption is performed by the external vacuum grooves 122b and 124b, and the outer part of the second wafer 20 may be adsorbed and fixed to the lower surface of the upper support plate 120. Unlike this, when the second vacuum pump 142 stops operating, the outer part of the second wafer 20 may be released (separated) from the lower surface of the upper support plate 120.

The plurality of vacuum grooves 112a, 112b, 114a and 114b of the lower support plate 110 may be connected to a third vacuum pumps 144 through an internal pipe formed inside the lower support plate 110 and an external pipe formed outside thereof. When the third vacuum pump 144 operates, vacuum adsorption is performed by the plurality of vacuum grooves 112a, 112b, 114a and 114b, and the first wafer 10 may be adsorbed and fixed to the upper surface of the lower support plate 110. Unlike this, when the third vacuum pump 144 stops operating, the first wafer 10 may be released (separated) from the upper surface of the lower support plate 110.

Such vacuum pumps 140, 142 and 144 receive provision of each of control signals CS2, CS3 and CS4 from the controller 150, and may initiate or terminate the vacuum adsorption operation in accordance with the values of the control signals CS2, CS3 and CS4. However, a method of fixing the first wafer 10 to the lower support plate 110 is not limited to the vacuum adsorption. For example, the lower support plate 110 may fix the first wafer 10, using the electrostatic force like an electrostatic chuck. Also, the lower support plate 110 may fix the first wafer 10, using a physical fixing device such as a lift pin or a holder.

The pressing device 130 may move the pin 132 disposed at the center of the upper support plate 120 upward and downward to penetrate the upper support plate 120. Specifically, the pressing device 130 may press (pin down) the central part of the second wafer 20 fixed onto the lower surface of the upper support plate 120 by the pin 132 to be moved in a downward direction. As a result, after the central part of the second wafer 20 starts bonding with the central part of the first wafer 10, the bonding of the first wafer 10 and the second wafer 20 in the outer direction may spread.

While the bonding spreads, the second wafer 20 is separated from the lower surface of the upper support plate 120. That is, as the bonding of the first wafer 10 and the second wafer 20 spreads from their central parts in the outer direction, the separation of the second wafer 20 may also spread from the central part in the outer direction.

The controller 150 may be implemented in the form of a kind of circuit, an electronic component, a microprocessor or a program or the like which may apply each of the control signals CS1, CS2, CS3 and CS4 to the pressing device 130 and the vacuum pump 140, 142 and 144ely. In addition, the controller 150 may control movement of a lower structure 116 and an upper structure 126 to be described later.

The controller 150 may be included in, may include, and/or may be implemented by, one or more instances of processing circuitry, such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc. In some example embodiments, the processing circuitry may include a non-transitory computer readable storage device, for example a solid state drive (SSD), storing a program of instructions, and a processor configured to execute the program of instructions to implement the functionality of the controller 150.

The lower structure 116 and the upper structure 126 adjust an interval of movement passage of air at the outer parts of the first wafer 10 and the second wafer 20 while performing the bonding process of the first wafer 10 and the second wafer 20. Specifically, a situation is prevented in which, while the bonding of the first wafer 10 and the second wafer 20 spreads from their central parts, the movement passage of air exiting in the outer direction of the first wafer 10 and the second wafer 20 is made narrow to trap moisture between the first wafer 10 and the second wafer 20 and cause an occurrence of defects.

Specifically, if the outer parts of the first wafer 10 and the second wafer 20 are directly exposed to the atmosphere without the lower structure 116 and the upper structure 126, moisture may be trapped between the first wafer 10 and the second wafer 20. When pin-down is performed on the second wafer 20 loaded on the upper support plate 120, the second wafer 20 approaches the first wafer 10 loaded on the lower support plate 110 from its center. A high-pressure air layer may be formed temporarily between the second wafer 20 and the first wafer 10 accordingly.

While the high-pressure air layer is ejected to the outside (that is, atmospheric pressure) of the first wafer 10 and the second wafer 20 at the outer parts of the first wafer 10 and the second wafer 20, the pressure decreases. As a result, the temperature of the air layer is reduced, and moisture may condense between the first wafer 10 and the second wafer 20. As bonding of the first wafer 10 and the second wafer 20 proceeds, the condensed moisture is trapped between the first wafer 10 and the second wafer 20, and as a result, there is a risk of causing defects (or void).

The lower structure 116 and the upper structure 126 cause an effect of moving the position at which moisture may condense to an outer side farther than the outer surfaces of the first wafer 10 and the second wafer 20, thereby preventing the defect caused by the moisture trap.

Referring to FIGS. 2 and 1 together, the upper structure 126 may be disposed adjacent to the upper support plate 120 to be movable in the vertical direction (e.g., direction D2, which may be perpendicular to the lower surface 120b of the upper support plate 120 and/or the upper surface 110u of the lower support plate 110). It will be understood that the vertical direction (e.g., D2) may be perpendicular to both the lower surface 120b of the upper support plate 120 and the upper surface 110u of the lower support plate 110. That is, the upper structure 126 may be disposed to surround the outer surface of the second wafer 20 fixed to the upper support plate 120 and to be movable in the vertical direction in FIG. 1.

Next, referring to FIGS. 3 and 1 together, the lower structure 116 may be disposed adjacent to the lower support plate 110 to be movable in the vertical direction (e.g., direction D2, which may be perpendicular to the lower surface 120b of the upper support plate 120 and/or the upper surface 110u of the lower support plate 110). That is, the lower structure 116 may be disposed to partially or entirely surround the outer surface 10o of the first wafer 10 fixed to (e.g., structurally supported by) the lower support plate 110 and to be movable in the vertical direction (e.g., direction D2) in FIG. 1.

A wafer bonding method according to some example embodiments of the present inventive concepts will now be described with reference to FIGS. 4, 5, 6, 7, and 8.

FIGS. 4, 5, 6, 7, and 8 are diagrams for explaining the wafer bonding method using the wafer bonding apparatus 100 according to some example embodiments of the present inventive concepts. Some or all of the method may be implemented and/or controlled by controller 150.

Figure 4:
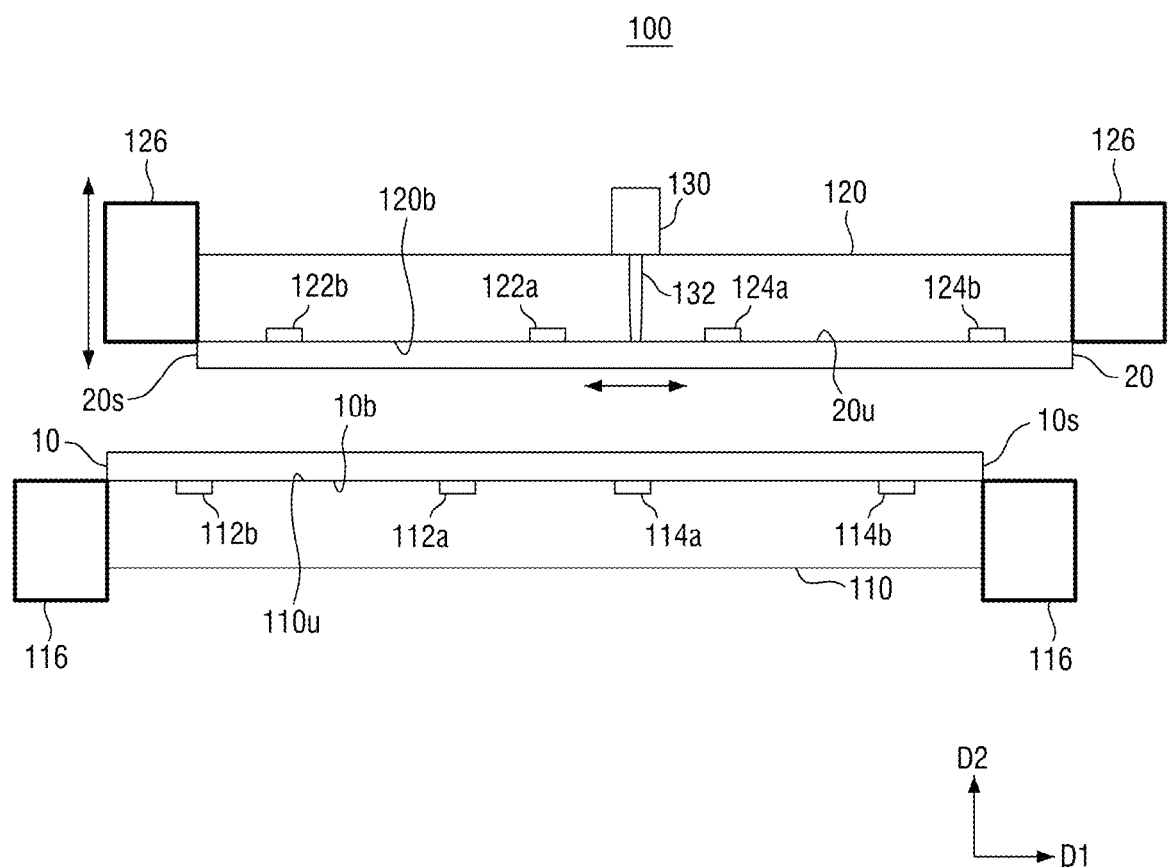
FIGS. 4, 5, 6, 7, and 8 are diagrams for explaining a wafer bonding method using the wafer bonding apparatus according to some example embodiments of the present inventive concepts.

Referring to FIG. 4, in a stage moving step, the lower structure 116 and the upper structure 126 may (e.g., under control of the controller 150) be located basically at the outer parts of the lower support plate 110 and the upper support plate 120. For example, the upper surface of the lower structure 116 may be located to have a height lower than or equal to a height of the upper surface of the lower support plate 110, and the lower surface of the upper structure 126 may be located to have a height higher than or equal to a height of the lower surface of the upper support plate 120.

In the stage moving step, the upper support plate 120 may (e.g., under control of the controller 150) move vertically and laterally (e.g., in a direction, including direction D1, that is parallel to the upper surface 110u of the lower support plate 110 and/or the lower surface 120b of the upper support plate 120) so that the upper support plate 120 can be arranged with respect to the lower support plate 110. Thus, the lower support plate 110 and the upper support plate 120 are arranged at a bonding position, and the first wafer 10 and the second wafer 20 are also arranged.

In a step of FIG. 4, the first vacuum pump 140 operates (e.g., under control of the controller 150) to perform vacuum adsorption by the internal vacuum grooves 122a and 124a, and the central part of the second wafer 20 may be adsorbed and fixed to the lower surface 120b of the upper support plate 120. Accordingly, as shown in FIG. 4, the upper support plate 120 may structurally support the second wafer 20 on the lower surface 120b of the upper support plate 120. It will be understood that, to structurally support the second wafer 20 on the lower surface 120b, the upper support plate 120 may contact, at lower surface 120b, some or all of the upper surface 20u of the second wafer 20 and may affix (e.g., fix) the second wafer 20 to the upper support plate 120 via the vacuum generated in the internal vacuum grooves 122a and 124a so as to cause the upper support plate 120 to support some or all of the structural load (e.g., weight) of the second wafer 20.

Further, the second vacuum pump 142 (e.g., under control of the controller 150) may operate to perform vacuum adsorption by the external vacuum grooves 122b and 124b, and the outer part of the second wafer 20 may be adsorbed and fixed to the lower surface of the upper support plate 120. Also, the third vacuum pump 144 operates to perform vacuum adsorption by the plurality of vacuum grooves 112a, 112b, 114a and 114b, and the first wafer 10 may be adsorbed and fixed to the upper surface 110u of the lower support plate 110. Accordingly, as shown in FIG. 4, the lower support plate 110 may structurally support the first wafer 10 on the upper surface 110u of the lower support plate 110. It will be understood that, to structurally support the first wafer 10 on the upper surface 110u, the lower support plate 110 may contact, at upper surface 110u, some or all of the bottom surface 10b of the first wafer 10 so as to support some or all of the structural load (e.g., weight) of the first wafer 10 through the interface between the contacting upper surface 110u and the some or all of the bottom surface 10b.

Figure 5:
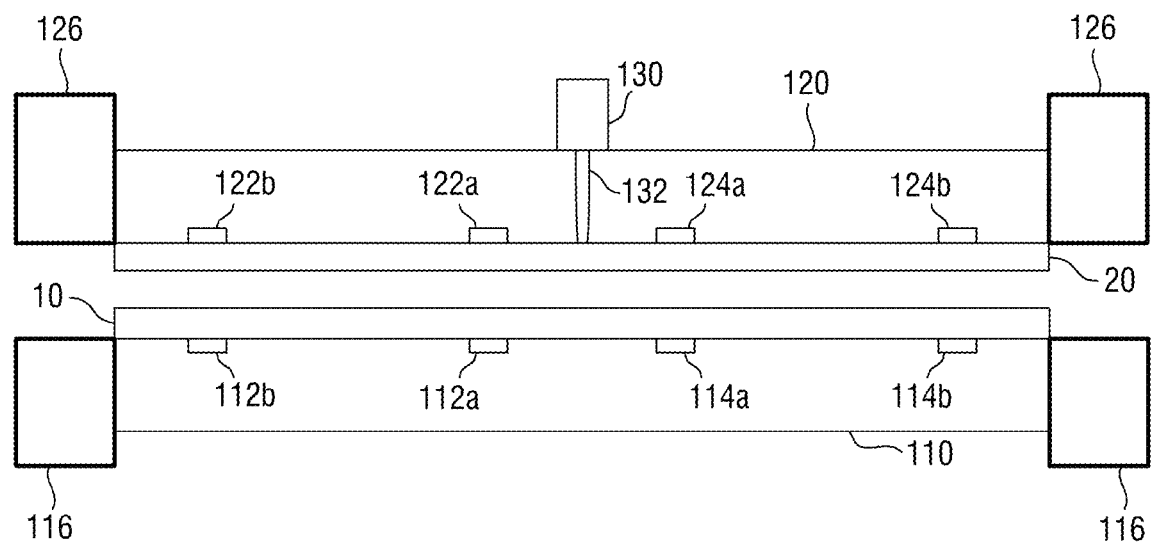
Figure 5:
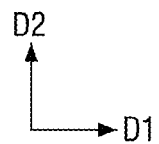

Subsequently, referring to FIG. 5, after the first wafer 10 and the second wafer 20 are arranged at the bonding position, a distance between the upper surface of the first wafer 10 and the lower surface of the second wafer 20 is maintained between tens to hundreds of um. That is, since the bonding is performed in such a state that the distance between the upper surface of the first wafer 10 and the lower surface of the second wafer 20 is very narrow, as described above, a high-pressure air layer may be temporarily formed between the second wafer 20 and the first wafer 10.

Figure 6:
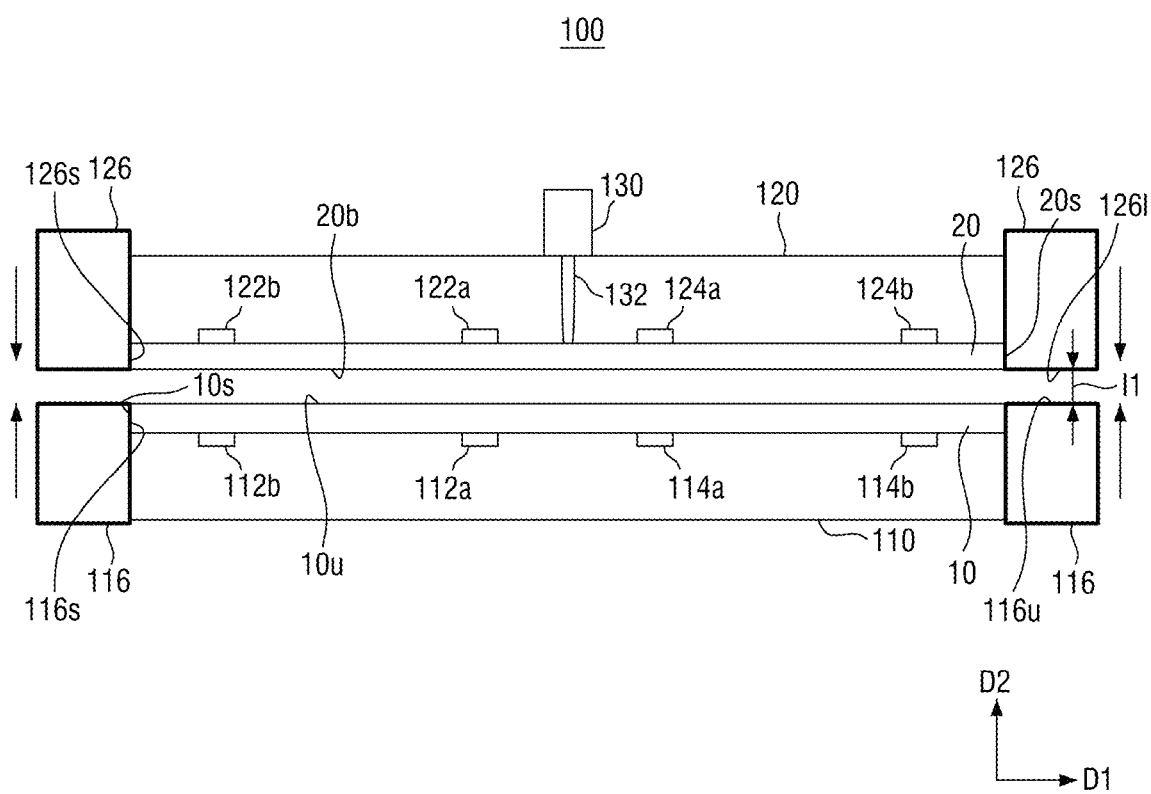

Next, referring to FIG. 6, after the first wafer 10 and the second wafer 20 are arranged at the bonding position, the lower structure 116 may (e.g., under control of the controller 150) move vertically (e.g., in the direction D2). For example, as shown in FIG. 6, the lower structure 116 may be configured to move toward the upper structure 126 in the vertical direction (e.g., direction D2) subsequently to the first wafer 10 being disposed on the upper surface 110u of the lower support plate 110. In another example, as shown in FIG. 6, the upper structure 126 may be configured to move toward the lower structure 116 in the vertical direction (e.g., direction D2) subsequently to the second wafer 20 being disposed on (e.g., affixed to, via application of vacuum to the second wafer via internal vacuum grooves 122a and 124a) the lower surface 120b of the upper support plate 120. The upper structure 126 and the lower structure 116 may move in the vertical direction independently of each other (e.g., at different times). It will be understood that, in some example embodiments, the upper and lower structures 116 and 126 may simultaneously move towards each other in the vertical direction. In some example embodiments, the lower structure 116 may be configured to move toward the upper structure 126 in the vertical direction (e.g., direction D2) simultaneously with the upper structure 126 maintaining a fixed position in the vertical direction, relative to an external reference point. In some example embodiments, the upper structure 126 may be configured to move toward the lower structure 116 in the vertical direction (e.g., direction D2) simultaneously with the lower structure 116 maintaining a fixed position in the vertical direction, relative to an external reference point. However, the scope of the present inventive concepts is not limited thereto, and the lower structure 116 may move in the upward direction at an arbitrary time after the first wafer 10 is disposed on the lower support plate 110.

As illustrated in some example embodiments, including the example embodiments shown in FIG. 6, at least a part of one side surface 116S of the moved lower structure 116 may come into contact with one side surface 10s (e.g., outer side surface) of the first wafer 10 based on the lower structure 116 being moved in the vertical direction (e.g., direction D2), for example being moved toward the upper structure 126 in said vertical direction. Meanwhile, the upper surface 116u of the moved lower structure 116 may have the same height as (e.g., may be caused to be coplanar with) the upper surface 10u of the first wafer 10, based on the lower structure 116 being moved in the vertical direction (e.g., direction D2), for example being moved toward the upper structure 126 in said vertical direction. It will be understood that surfaces that are described as being "coplanar" with each other herein may be substantially coplanar with each other, wherein surfaces that are substantially coplanar with each other are coplanar with each other within manufacturing tolerances and/or material tolerances.

Also, after the first wafer 10 and the second wafer 20 are arranged at the bonding position, the upper structure 126 may (e.g., under control of the controller 150) move in a downward direction (e.g., downward in the vertical direction). However, the scope of the present inventive concepts is not limited thereto, and the upper structure 126 may move in the downward direction at an arbitrary time after the second wafer 20 is disposed on the upper support plate 120.

As illustrated in some example embodiments, including the example embodiments shown in FIG. 6, at least a part of one side surface 126s of the moved upper structure 126 may come into contact with one side surface 20s (e.g., outer side surface) of the second wafer 20 based on the upper structure 126 being moved in the vertical direction (e.g., direction D2), for example being moved toward the lower structure 116 in said vertical direction. In some example embodiments, the height of the lower surface 126l of the moved upper structure 126 may be the same as (e.g., may be caused to be coplanar with) the height of the lower surface 20b of the second wafer 20, based on the upper structure 126 being moved in the vertical direction (e.g., direction D2), for example being moved toward the lower structure 116 in said vertical direction.

As the lower structure 116 moves in the upward direction and the upper structure 126 moves in the downward direction in this way, the distance between the upper surface of the lower structure 116 and the lower surface of the upper structure 126 may be substantially the same as the distance between the upper surface of the first wafer 10 and the lower surface of the second wafer 20.

Figure 7:
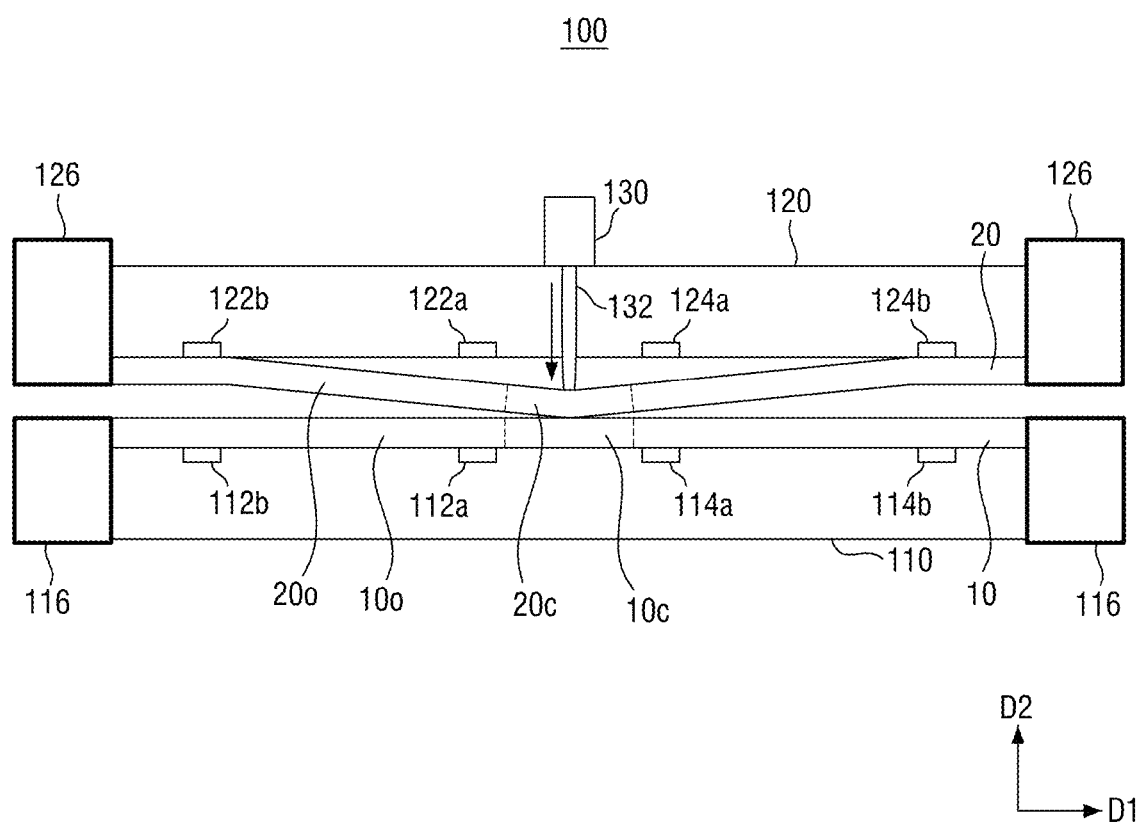

Next, referring to FIG. 7, the pressing device 130 may (e.g., under control of the controller 150) move the pin 132 in the downward direction (e.g., downward in the vertical direction) to perform a pin-down operation. Therefore, the central part 20c of the second wafer 20 starts bonding with the central part 10c of the first wafer 10, and at the same time, the second wafer 20 starts to be separated from the lower surface 120b of the upper support plate 120 starting from the central part 20c.

Thereafter, the bonding of the first wafer 10 and the second wafer 20 spreads in the outward direction (e.g., towards the respective side surfaces 10s and 20s from the respective center parts 10c and 20c), and at the same time, the separation of the second wafer 20 also spreads in the outward direction at the central part 20c thereof.

In some example embodiments, the first vacuum pump 140 may (e.g., under control of the controller 150) stop operating so that the central part 20c of the second wafer 20 is separated from the lower surface 120b of the upper support plate 120. In some example embodiments, the second vacuum pump 142 still operates and the vacuum adsorption is performed by the external vacuum grooves 122b and 124b such that the outer part 20o of the second wafer 20 may be still adsorbed and fixed (e.g., affixed) to the lower surface 120b of the upper support plate 120.

Figure 8:
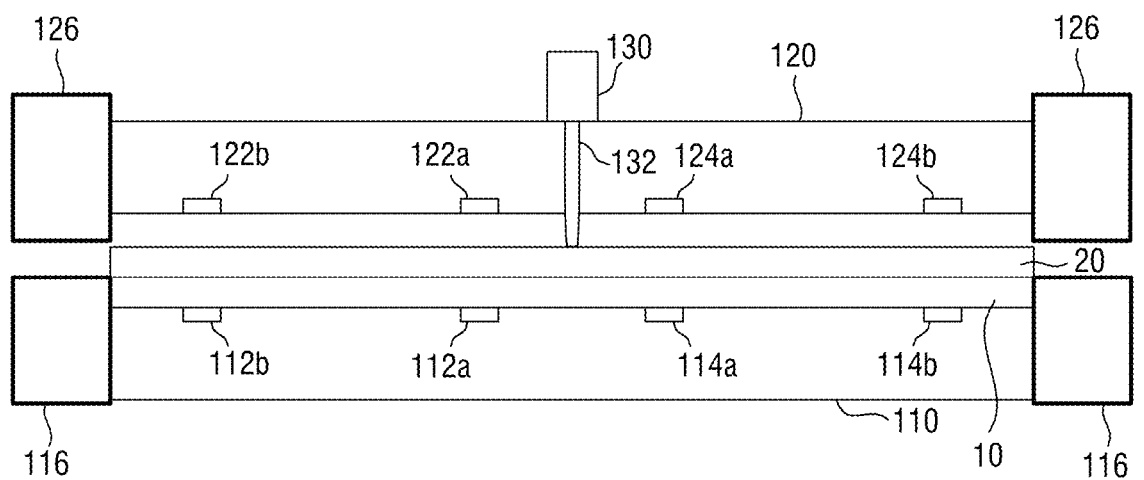
Figure 8:
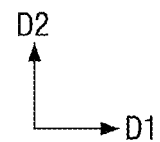

Next, referring to FIG. 8, the bonding of the first wafer 10 and the second wafer 20 is completed. The lower structure 116 and the upper structure 126 may (e.g., under control of the controller 150) be moved in accordance with FIG. 6 to expand a route in which the high-pressure air layer is ejected to the atmospheric pressure. For example, the lower structure 116 may be configured to move downwards (e.g., away from the upper structure 126) in the vertical direction subsequently to the bonding of the first wafer 10 and the second wafer 20 to each other being completed. In another example, the upper structure 126 may be configured to move upwards (e.g., away from the lower structure 116) in the vertical direction subsequently to the bonding of the first wafer 10 and the second wafer 20 to each other being completed. In some example embodiments, the upper structure 126 and the lower structure 116 may simultaneously move away from each other in the vertical direction subsequently to the bonding of the first wafer 10 and the second wafer 20 to each other being completed. The upper structure 126 and the lower structure 116 may move independently of each other and/or at different times. In some example embodiments, only one of the lower structure 116 or the upper structure 126 may move in the vertical direction subsequently to the bonding of the first wafer 10 and the second wafer 20 to each other being completed. Thus, the lower structure 116 and the upper structure 126 cause an effect of moving the position at which moisture may condense to an outer side farther than the outer surfaces of the first wafer 10 and the second wafer 20, thereby making it possible to prevent a defect caused by moisture trap.

In a step of FIG. 8, the second vacuum pump 142 may also (e.g., under control of the controller 150) stop operating so that the outer part of the second wafer 20 may be completely separated from the lower surface of the upper support plate 120.

In some example embodiments of the present inventive concepts, the lower structure 116 may (e.g., under control of the controller 150) move in the downward direction (i.e., move back to its original position) after the bonding of the first wafer 10 and the second wafer 20 is completed. In addition, the upper structure 126 may (e.g., under control of the controller 150) move in the upward direction (i.e., move to the original position) after the bonding of the first wafer 10 and the second wafer 20 is completed.

In this way, since the wafer bonding apparatus 100 according to some example embodiments of the present inventive concepts is provided with the lower structure 116 and the upper structure 126 disposed adjacent to each of the lower support plate 110 and the upper support plate 120 to be movable in the vertical direction, it is possible to move the position at which moisture may condense to the outer side farther than the outer surfaces of the first wafer 10 and the second wafer 20.

The lower structure 116 and the upper structure 126 may move vertically in accordance with the control of the controller 150 illustrated in FIG. 1. That is, the controller 150 may adjust an interval (e.g., size of a spacing, distance of spacing in the vertical direction D2 and/or lateral direction D1, any combination thereof, or the like) between the lower structure 116 and the upper structure 126 appropriately according to the progress of the wafer bonding process. Specifically, the controller 150 may move the lower structure 116 and the upper structure 126 so that the interval I1 between the upper surface 116u of the lower structure 116 and the lower surface 126l of the upper structure 126 (e.g., distance in the vertical direction, or distance in direction D2) narrows after the lower support plate 110 and the upper support plate 120 are arranged for bonding the first wafer 10 and the second wafer 20. To arrange the lower support plate 110 and the upper support plate 120 for bonding the first wafer 10 and the second wafer 20, the controller 150 may cause at least one of the upper structure 126 or the lower structure 116 to move in the lateral direction (e.g., direction D1) to align the respective center parts 10c and 20c of the first wafer 10 and the second wafer 20 in the vertical direction (e.g., direction D2). In addition, the controller 150 may move the lower structure 116 and the upper structure 126 so that the interval I1 between the upper surface of the lower structure 116 and the lower surface of the upper structure 126 widens after the bonding of the first wafer 10 and the second wafer 20 is completed.

Figure 9:
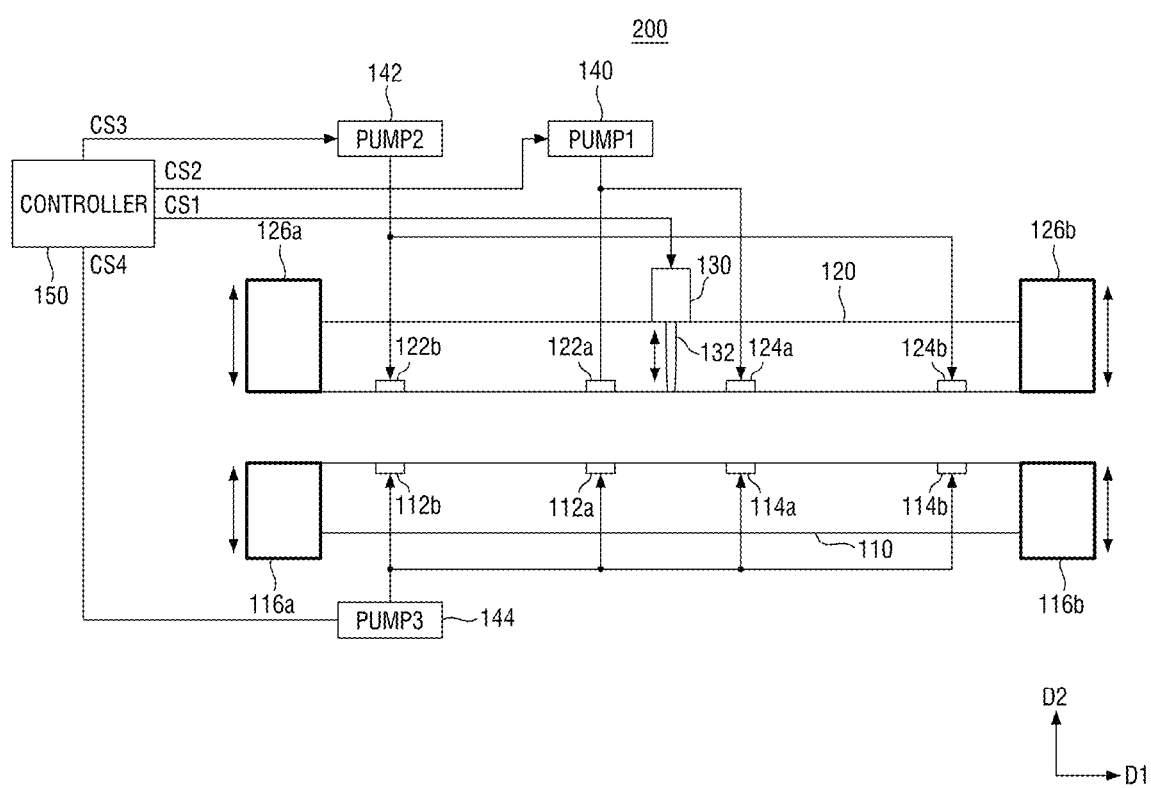
FIGS. 9, 10, and 11 are diagrams for explaining a wafer bonding apparatus according to some example embodiments of the present inventive concepts.
Figure 10:
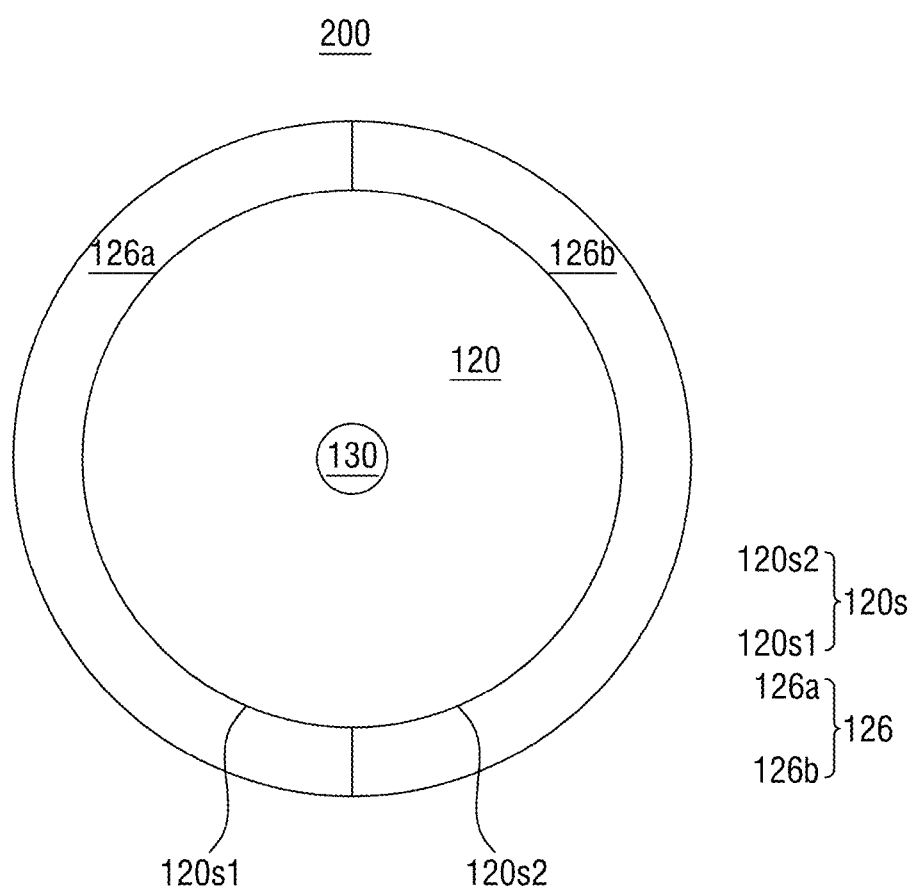
Figure 11:
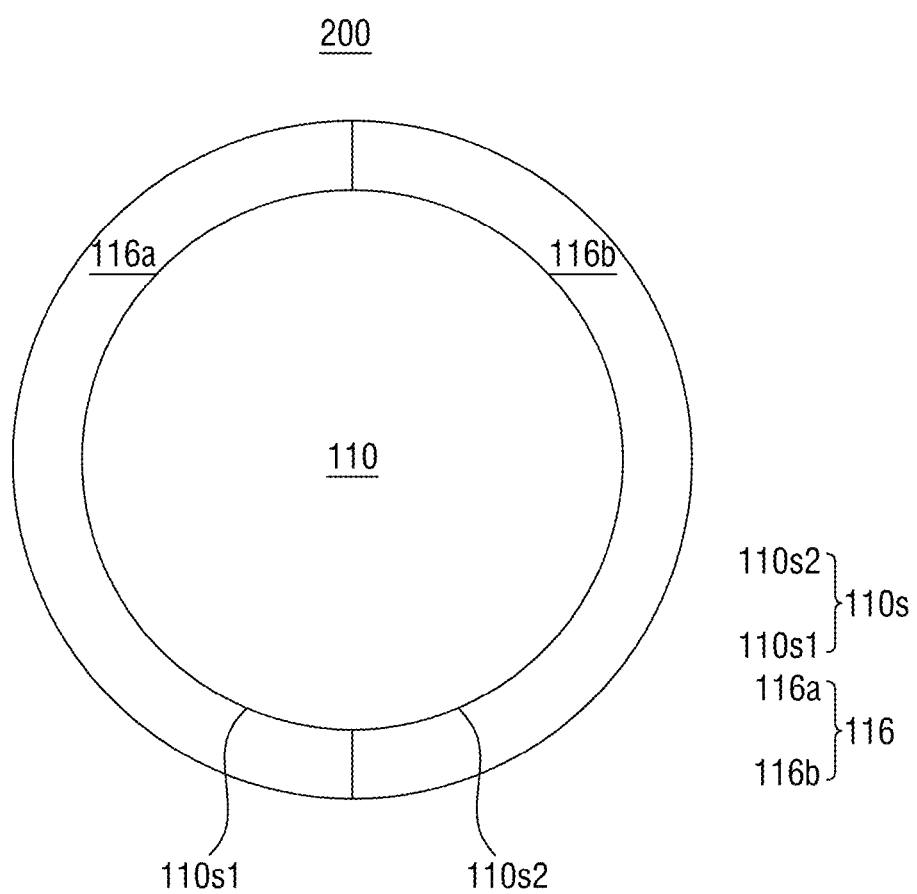

FIGS. 9, 10, and 11 are diagrams for explaining a wafer bonding apparatus 200 according to some example embodiments of the present inventive concepts. Specifically, FIG. 9 is a cross-sectional view of the wafer bonding apparatus 200, FIG. 10 is a top view of the wafer bonding apparatus 200, and FIG. 11 is a bottom view of the wafer bonding apparatus 200.

Referring to FIG. 9, the wafer bonding apparatus 200 according to some example embodiments of the present inventive concepts may include a lower support plate 110, a plurality of sub-lower structures 116a and 116b, an upper support plate 120, a plurality of sub-upper structure 126a and 126b, a pressing device 130 and a controller 150.

The lower support plate 110 is also referred to as a lower chuck, and the first wafer 10 may be disposed on the upper surface of the lower support plate 110. In some example embodiments, the lower support plate 110 may include a plurality of vacuum grooves 112a, 112b, 114a and 114b for fixing the first wafer 10 to the upper surface thereof.

A plurality of vacuum grooves 112a, 112b, 114a and 114b of the lower support plate 110 may include internal vacuum grooves 112a and 114a disposed to be adjacent to the center of the lower support plate 110, and external vacuum grooves 112b and 114b disposed to be adjacent to the outer part of the support plate 110. The positions and the number of vacuum grooves illustrated in the drawing are merely an example, and the scope of the present inventive concepts is not limited thereto.

The plurality of vacuum grooves 112a, 112b, 114a and 114b of the lower support plate 110 may be disposed along a circular shape when viewed from the upper surface of the lower support plate 110. However, the scope of the present inventive concepts is not limited thereto, and the plurality of vacuum grooves 112a, 112b, 114a and 114b may have an arbitrary arrangement.

The upper support plate 120 is also referred to as an upper chuck, and a second wafer 20 bonded to the first wafer 10 may be disposed on the lower surface of the upper support plate 120. In some example embodiments, the upper support plate 120 may include a plurality of vacuum grooves 122a, 122b, 124a and 124b for fixing the second wafer 20 to the lower surface thereof.

The plurality of vacuum grooves 122a, 122b, 124a and 124b of the upper support plate 120 may include internal vacuum grooves 122a and 124a disposed to be adjacent to the center of the upper support plate 120, and external vacuum grooves 122b and 124b disposed to be adjacent to the outer part of the upper support plate 120. The positions and the number of vacuum grooves illustrated in the drawing are merely an example, and the scope of the present inventive concepts is not limited thereto.

The plurality of vacuum grooves 122a, 122b, 124a and 124b of the upper support plate 120 may be disposed along a circular shape when viewed from the lower surface of the upper support plate 120. However, the scope of the present inventive concepts is not limited thereto, and the plurality of vacuum grooves 122a, 122b, 124a and 124b may have an arbitrary arrangement.

The internal vacuum grooves 122a and 124a of the upper support plate 120 may be connected to the first vacuum pump 140 through an internal pipe formed inside the upper support plate 120 and an external pipe formed outside thereof. When the first vacuum pump 140 operates, vacuum adsorption is performed by the internal vacuum grooves 122a and 124a, and the central part of the second wafer 20 may be adsorbed and fixed to the lower surface of the upper support plate 120. Unlike this, when the first vacuum pump 140 stops operating, the central part of the second wafer 20 may be released (separated) from the lower surface of the upper support plate 120.

The external vacuum grooves 122b and 124b of the upper support plate 120 may be connected to a second vacuum pump through an internal pipe formed inside the upper support plate 120 and an external pipe formed outside thereof. When the second vacuum pump 142 operates, vacuum adsorption is performed by the external vacuum grooves 122b and 124b, and the outer part of the second wafer 20 may be adsorbed and fixed to the lower surface of the upper support plate 120. Unlike this, when the second vacuum pump 142 stops operating, the outer part of the second wafer 20 may be released (separated) from the lower surface of the upper support plate 120.

The plurality of vacuum grooves 112a, 112b, 114a and 114b of the lower support plate 110 may be connected to the third vacuum pumps 144 through the internal pipe formed inside the lower support plate 110 and the external pipe formed outside thereof. When the third vacuum pump 144 operates, vacuum adsorption is performed by the plurality of vacuum grooves 112a, 112b, 114a and 114b, and the first wafer 10 may be adsorbed and fixed to the upper surface of the lower support plate 110. Unlike this, when the third vacuum pump 144 stops operating, the first wafer 10 may be unlocked (separated) from the upper surface of the lower support plate 110.

Such vacuum pumps 140, 142 and 144 receive provision of each of the control signals CS2, CS3 and CS4 from the controller 150, and may initiate or terminate the vacuum adsorption operation in accordance with the values of the control signals CS2, CS3 and CS4. However, the method of fixing the first wafer 10 to the lower support plate 110 is not limited to the vacuum adsorption. For example, the lower support plate 110 may also fix the first wafer 10, using the electrostatic force like an electrostatic chuck. Also, the lower support plate 110 may also fix the first wafer 10, using a physical fixing device such as a lift pin or a holder.

The pressing device 130 may move the pin 132 disposed at the center of the upper support plate 120 upward and downward to penetrate the upper support plate 120. Specifically, the pressing device 130 may press (pin down) the central part of the second wafer 20 fixed onto the lower surface of the upper support plate 120 by the pin 132 to move in the downward direction. As a result, after the central part of the second wafer 20 starts bonding with the central part of the first wafer 10, the bonding of the first wafer 10 and the second wafer 20 in the outer direction may spread.

While the bonding spreads, the second wafer 20 is separated from the lower surface of the upper support plate 120. That is, as the bonding of the first wafer 10 and the second wafer 20 spreads from their central parts in the outer direction, the separation of the second wafer 20 may also spread from the central part in the outer direction.

The controller 150 may be implemented in the form of a kind of circuit, an electronic component, a microprocessor, a program or the like which may apply the control signals CS1, CS2, CS3 and CS4 to the pressing device 130 and the vacuum pump 140, 142 and 144, respectively. Also, the controller 150 may independently control the movement of a first sub-lower structure 116a and a second sub-lower structure 116b to be described later. In addition, the controller 150 may independently control movement of a first sub-upper structure 126a and a second sub-upper structure 126b to be described later.

Referring to FIGS. 10 and 9 together, in some example embodiments, the upper structure 126 may include a first sub-upper structure 126a and a second sub-upper structure 126b. The first sub-upper structure 126a and the second sub-upper structure 126b may be disposed adjacent to separate, respective surfaces 120s1 and 120s2 (collectively defining an outer surface 120s) of the upper support plate 120 to be movable in the vertical direction (e.g., direction D2). That is, the first sub-upper structure 126a and the second sub-upper structure 126b may be disposed to surround the outer surface of the second wafer 20 (e.g., side surface 20s) fixed to the upper support plate 120 and configured to be movable in the vertical direction in FIG. 9.

That is, the first sub-upper structure 126a may be disposed (e.g., configured) to be movable adjacent to one side surface of the upper support plate 120. The second sub-upper structure 126b may be disposed (e.g., configured) to be movable adjacent to the other side surface of the upper support plate 120.

The first sub-upper structure 126a and the second sub-upper structure 126b may be configured to move in the vertical direction (e.g., direction D2) independently of each other. For example, the first sub-upper structure 126a may move in the vertical direction while the second sub-upper structure 126b does not move, the second sub-upper structure 126b may move in the vertical direction while the first sub-upper structure 126a does not move, the first and second sub-upper structures 126a and 126b may move simultaneously in the vertical direction in the same or opposite directions (e.g., both upwards, both downwards, one upward and the other downward) and in the same or different rate of motion, any combination thereof, or the like.

Subsequently, referring to FIGS. 11 and 9 together, in some example embodiments, the lower structure 116 may include a first sub-lower structure 116a and a second sub-lower structure 116b. The first sub-lower structure 116a and the second sub-lower structure 116b may be disposed adjacent to separate, respective surfaces 110s1 and 110s2 (collectively defining an outer surface 110s) of the lower support plate 110 to be movable in the vertical direction (e.g., direction D2). That is, the first sub-lower structure 116a and the second sub-lower structure 116b may be disposed to surround the outer surface (e.g., side surface 10s) of the first wafer 10 fixed to the lower support plate 110 and to be movable in the vertical direction in FIG. 9.

That is, the first sub-lower structure 116a may be disposed to be movable adjacent to one side surface of the lower support plate 110. Further, the second sub-lower structure 116b may be disposed to be movable adjacent to the other side surface of the lower support plate 110.

The first sub-lower structure 116a and the second sub-lower structure 116b may be configured to be moved in the vertical direction (e.g., direction D2) independently of each other. For example, the first sub-lower structure 116a may move in the vertical direction while the second sub-lower structure 116b does not move, the second sub-lower structure 116b may move in the vertical direction while the first sub-lower structure 116a does not move, the first and second sub-lower structures 116a and 116b may move simultaneously in the vertical direction in the same or opposite directions (e.g., both upwards, both downwards, one upward and the other downward) and in the same or different rate of motion, any combination thereof, or the like.

The first sub-lower structure 116a and the second sub-lower structure 116b, and the first sub-upper structure 126a and the second sub-upper structure 126b adjust the interval of the movement passage of air on the outer parts of the first wafer 10 and the second wafer 20, while performing the bonding process of the first wafer 10 and the second wafer 20. Specifically, a situation is prevented in which, while the bonding of the first wafer 10 and the second wafer 20 spreads from their central parts, the movement passage of air exiting in the outer direction of the first wafer 10 and the second wafer 20 is made narrow to trap moisture between the first wafer 10 and the second wafer 20 and cause an occurrence of defects.

Although FIGS. 9 to 11 illustrate that two sub-lower structures surround the outer surface of the lower support plate 110 or the upper support plate 120, the sub-lower structures may be implemented in any number such as three or four depending on the specific implementation purpose.

Figure 12:
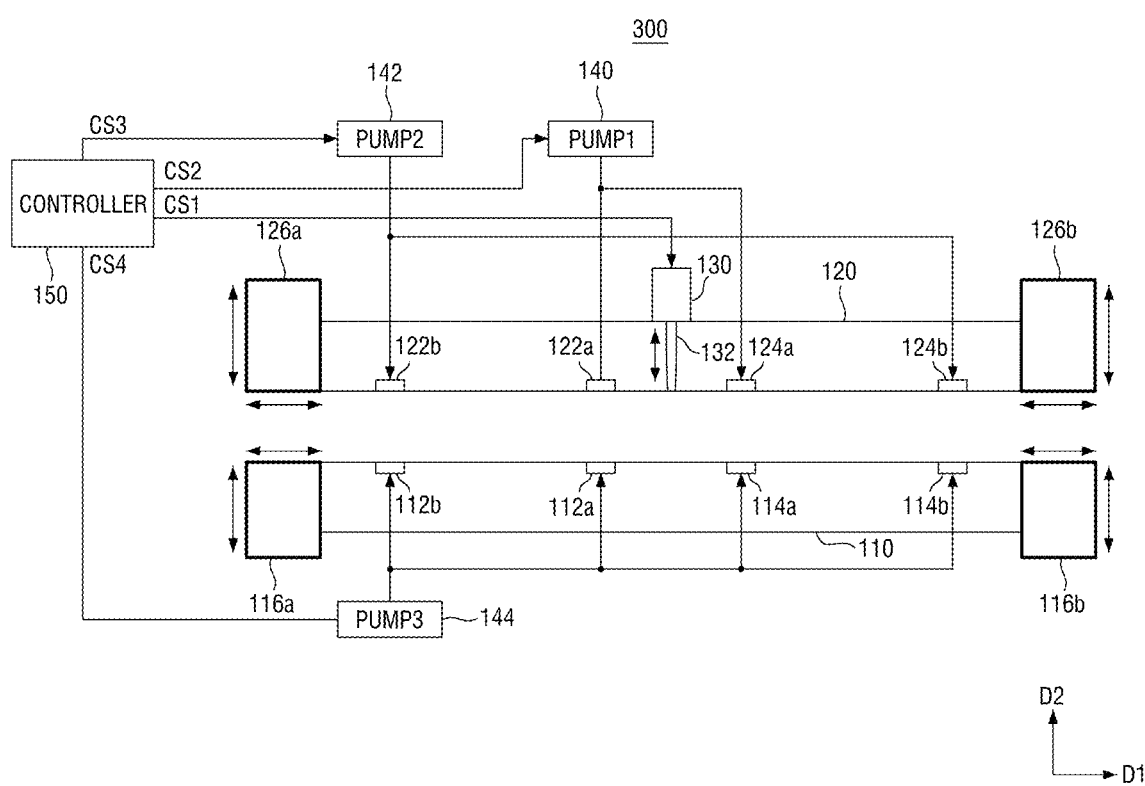
FIG. 12 is a diagram for explaining a wafer bonding apparatus according to some example embodiments of the present inventive concepts.

FIG. 12 is a diagram for explaining a wafer bonding apparatus 300 according to some example embodiments of the present inventive concepts. Specifically, FIG. 12 is a cross-sectional view of the wafer bonding apparatus 300.

Referring to FIG. 12, a wafer bonding apparatus 300 according to some example embodiments of the present inventive concepts may include a lower support plate 110, a plurality of sub-lower structures 116a and 116b, an upper support plate 120, a plurality of sub-upper structures 126a and 126b, a pressing device 130 and a controller 150.

Since the contents of the lower support plate 110, the upper support plate 120, and the pressing device 130 are substantially the same as the contents described in FIG. 1, repeated description will not be provided here.

In some example embodiments, the controller 150 may control the lateral direction (e.g., direction D1 that is parallel to the upper surface 110u of the lower support plate 110 and/or the lower surface 120b of the upper support plate 120) of the first sub-upper structure 126a and the second sub-upper structure 126b.

That is, at least one of the first sub-lower structure 116a or the second sub-lower structure 116b is movable (e.g., is configured to move) in the lateral direction (e.g., in a direction D1 that is parallel to the upper surface 110u of the lower support plate 110 and/or the lower surface 120b of the upper support plate 120). Further, at least one of the first sub-upper structure 126a or the second sub-upper structure 126b is movable in the lateral direction.

In concluding the detailed description, those skilled in the art will appreciate that many variations and modifications may be made to the preferred embodiments without substantially departing from the principles of the present inventive concepts. Therefore, the disclosed preferred embodiments of the inventive concepts are used in a generic and descriptive sense only and not for purposes of limitation.

The present inventive concepts have been described with reference to the attached drawings, but it may be understood by one of ordinary skill in the art that the present inventive concepts may be performed by one having ordinary skill in the art in other specific forms without changing the technical concept or essential features of the present inventive concepts. Further, the above-described example embodiments are merely examples and do not limit the scope of the rights of the present inventive concepts.

What is claimed is:

1. A wafer bonding apparatus, comprising:
   a lower support plate configured to structurally support a first wafer on an upper surface of the lower support plate;
   a lower structure adjacent to the lower support plate, the lower structure movable in a vertical direction that is perpendicular to the upper surface of the lower support plate, the lower structure configured to move in the vertical direction in relation to the lower support plate concurrently with the lower structure being vertically exposed from vertical overlap in the vertical direction by the first wafer supported on the upper surface of the lower support plate;
   an upper support plate configured to structurally support a second wafer on a lower surface of the upper support plate; and
   an upper structure adjacent to the upper support plate, the upper structure movable in the vertical direction, the upper structure configured to move in the vertical direction in relation to the upper support plate concurrently with the upper structure being vertically exposed from vertical overlap in the vertical direction by the second wafer supported on the lower surface of the upper support plate, wherein
   the wafer bonding apparatus is configured to move the lower structure and the upper structure in the vertical direction while the lower support plate and the upper support plate remain at a fixed position in relation to each other to cause the first wafer and the second wafer to be maintained at a bonding position.

2. The wafer bonding apparatus of claim 1, wherein the lower structure is configured to move toward the upper structure in the vertical direction subsequent to the first wafer being disposed on the upper surface of the lower support plate.

3. The wafer bonding apparatus of claim 2, wherein
   the lower support plate is configured to structurally support the first wafer such that the upper surface of the lower support plate contacts a bottom surface of the first wafer, and
   the lower structure is configured to move toward the upper structure in the vertical direction such that at least a part of one side surface of the lower structure comes into contact with one lateral side surface of the first wafer that is separate from the bottom surface of the first wafer.

4. The wafer bonding apparatus of claim 2, wherein the lower structure is configured to move toward the upper structure in the vertical direction such that an upper surface of the lower structure is caused to be coplanar with an upper surface of the first wafer.

5. The wafer bonding apparatus of claim 1, wherein the upper structure is configured to move towards the lower structure in the vertical direction, subsequent to the second wafer being affixed to the lower surface of the upper support plate.

6. The wafer bonding apparatus of claim 5, wherein
   the upper support plate is configured to structurally support the second wafer such that the lower surface of the upper support plate contacts an upper surface of the second wafer, and
   the upper structure is configured to move towards the lower structure in the vertical direction such that at least a part of one side surface of the upper structure comes into contact with one lateral side surface of the second wafer that is separate from the upper surface of the second wafer.

7. The wafer bonding apparatus of claim 5, wherein the upper structure is configured to move towards the lower structure in the vertical direction such that a lower surface of the upper structure is caused to be coplanar with a lower surface of the second wafer.

8. The wafer bonding apparatus of claim 1, wherein the lower structure is configured to move away from the upper structure in the vertical direction subsequent to bonding of the first wafer and the second wafer to each other being completed.

9. The wafer bonding apparatus of claim 1, wherein the upper structure is configured to move away from the lower structure in the vertical direction subsequent to the bonding of the first wafer and the second wafer to each other being completed.

10. The wafer bonding apparatus of claim 1, wherein
    the lower structure includes a first sub-lower structure and a second sub-lower structure, and the first sub-lower structure and the second sub-lower structure are configured to move independently of each other in the vertical direction.

11. A wafer bonding apparatus, comprising:
a lower support plate configured to structurally support a first wafer on an upper surface of the lower support plate;
a lower structure adjacent to the lower support plate;
an upper support plate configured to structurally support a second wafer on a lower surface of the upper support plate;
an upper structure adjacent to the upper support plate; and
a controller configured to adjust an interval between the lower structure and the upper structure concurrently with the lower structure being vertically exposed from vertical overlap in a vertical direction that is perpendicular to the upper surface of the lower support plate by the first wafer supported on the upper surface of the lower support plate and the upper structure being vertically exposed from vertical overlap in the vertical direction by the second wafer supported on the lower surface of the upper support plate, wherein
the wafer bonding apparatus is configured to move the lower structure and the upper structure in the vertical direction while the lower support plate and the upper support plate remain at a fixed position in relation to each other to cause the first wafer and the second wafer to be maintained at a bonding position.

12. The wafer bonding apparatus of claim 11, wherein the controller is configured to move the lower structure and the upper structure so that an interval between an upper surface of the lower structure and a lower surface of the upper structure narrows after the lower support plate and the upper support plate are arranged for bonding the first wafer and the second wafer based on at least one of the upper structure or the lower structure being caused to move in a lateral direction that is parallel to the upper surface of the lower support plate to align respective center parts of the first wafer and the second wafer in a vertical direction that is perpendicular to the upper surface of the lower support plate.

13. The wafer bonding apparatus of claim 12, wherein the controller is configured to cause the lower structure to move toward the upper structure in the vertical direction such that at least a part of one side surface of the lower structure comes into contact with one lateral side surface of the first wafer that is separate from a bottom surface of the first wafer that is contacted by the upper surface of the lower support plate.

14. The wafer bonding apparatus of claim 12, wherein the controller is configured to cause the lower structure to move toward the upper structure in the vertical direction such that the upper surface of the lower structure is caused to be coplanar with an upper surface of the first wafer.

15. The wafer bonding apparatus of claim 12, wherein the controller is configured to cause the upper structure to move toward the lower structure in the vertical direction such that at least a part of one side surface of the upper structure comes into contact with one lateral side surface of the second wafer that is separate from an upper surface of the second wafer that is contacted by the lower surface of the upper support plate.

16. A wafer bonding apparatus comprising:
a lower support plate configured to structurally support a first wafer on an upper surface of the lower support plate;
a first sub-lower structure adjacent to one side surface of the lower support plate, the first sub-lower structure movable in a vertical direction that is perpendicular to the upper surface of the lower support plate;
a second sub-lower structure adjacent to another side surface of the lower support plate, the second sub-lower structure movable in the vertical direction;
an upper support plate configured to structurally support a second wafer on a lower surface of the upper support plate;
a first sub-upper structure adjacent to one side surface of the upper support plate, the first sub-upper structure movable in the vertical direction; and
a second sub-upper structure adjacent to another side surface of the upper support plate, the second sub-upper structure moveable in the vertical direction, wherein
the wafer bonding apparatus is configured to move the first and second sub-lower structures and the first and second sub-upper structures in the vertical direction while the lower support plate and the upper support plate remain at a fixed position in relation to each other to cause the first wafer and the second wafer to be maintained at a bonding position.

17. The wafer bonding apparatus of claim 16, wherein the first sub-lower structure and the second sub-lower structure are configured to move in the vertical direction independently of each other.

18. The wafer bonding apparatus of claim 16, wherein at least one of the first sub-lower structure or the second sub-lower structure is configured to move in a lateral direction that is parallel to the upper surface of the lower support plate.

19. The wafer bonding apparatus of claim 16, wherein the first sub-upper structure and the second sub-upper structure are configured to move in the vertical direction independently of each other.

20. The wafer bonding apparatus of claim 16, wherein at least one of the first sub-upper structure or the second sub-upper structure is configured to move in a lateral direction that is parallel to the upper surface of the lower support plate.

* * * * *